US008351217B2

(12) United States Patent
Watanabe

(10) Patent No.: US 8,351,217 B2
(45) Date of Patent: Jan. 8, 2013

(54) WIRING BOARD

(75) Inventor: Yuji Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 331 days.

(21) Appl. No.: 12/639,252

(22) Filed: Dec. 16, 2009

(65) Prior Publication Data

US 2010/0155110 A1  Jun. 24, 2010

(30) Foreign Application Priority Data

Dec. 24, 2008 (JP) ................................. 2008-327641

(51) Int. Cl.
H05K 7/00 (2006.01)
H05K 1/16 (2006.01)
H01L 23/495 (2006.01)
H01L 23/28 (2006.01)

(52) U.S. Cl. ......... 361/783; 174/260; 257/669; 257/787

(58) Field of Classification Search .................. 174/260; 361/783; 257/787–796, 773, 669
See application file for complete search history.

(56) References Cited

U.S. PATENT DOCUMENTS

| 5,757,067 | A  | * | 5/1998  | Inaba ........................... 257/666 |
| 6,177,724 | B1 | * | 1/2001  | Sawai ........................... 257/701 |
| 6,369,439 | B1 | * | 4/2002  | Tao et al. ...................... 257/666 |
| 6,469,369 | B1 | * | 10/2002 | Lee ................................ 257/670 |
| 6,486,537 | B1 | * | 11/2002 | Liebhard ....................... 257/667 |
| 6,897,093 | B2 | * | 5/2005  | Kasuga et al. ................. 438/112 |
| 7,102,217 | B2 | * | 9/2006  | Thurgood ...................... 257/673 |
| 7,220,607 | B2 | * | 5/2007  | Danno ........................... 438/26 |
| 7,288,833 | B2 | * | 10/2007 | Huat et al. ..................... 257/669 |
| 2002/0020940 | A1 | * | 2/2002  | Kiritani .................... 264/272.15 |
| 2004/0182742 | A1 | * | 9/2004  | Bontrager et al. ............ 206/706 |
| 2006/0180910 | A1 | * | 8/2006  | Miyazawa ..................... 257/685 |
| 2006/0216867 | A1 | * | 9/2006  | Kawata et al. ................ 438/124 |
| 2007/0216007 | A1 | * | 9/2007  | Lee et al. ....................... 257/686 |
| 2007/0262423 | A1 | * | 11/2007 | Dimaano et al. .............. 257/667 |
| 2007/0262462 | A1 | * | 11/2007 | Shimizu et al. ............... 257/773 |

FOREIGN PATENT DOCUMENTS

| JP | 2000-124163 A | 4/2000 |
| JP | 2002-76186 A  | 3/2002 |
| JP | 2003-37125 A  | 2/2003 |

* cited by examiner

*Primary Examiner* — Timothy Thompson
*Assistant Examiner* — Sherman Ng
(74) *Attorney, Agent, or Firm* — Foley & Lardner LLP

(57) ABSTRACT

A wiring board of the present invention comprises a plurality of device formation areas each for mounting a semiconductor chip thereon, and two or more slits formed in an area which comes into contact with a molding die when the wiring board is placed in a cavity of the molding die for forming a sealant to collectively cover the plurality of device formation areas.

16 Claims, 11 Drawing Sheets

WIRING BOARD

This application is based upon and claims the benefit of priority from Japanese patent application No. 2008-327641, filed on Dec. 24, 2008, the disclosure of which is incorporated herein in its entirety by reference.

BACKGROUND OF THE INVENTION

1. Field of the Invention

The present invention relates to a wiring board which comprises a plurality of device formation areas respectively for mounting semiconductor chips thereon.

2. Description of the Related Art

A MAP (Mold Array Process) technique is known as a method of manufacturing a BGA (Ball Grid Array) type semiconductor device. In the MAP technique, a BGA type semiconductor device is manufactured in the following manner. A semiconductor chip is mounted on each of a plurality of device formation areas defined on a wiring board. Next, the plurality of device formation areas which are mounted with the semiconductor chips are collectively sealed with resin. Subsequently, the wiring board is divided into the respective device formation areas to produce individual chips. Here, the wiring board is sealed with resin in the following manner. Specifically, the wiring board which is mounted with the semiconductor chips is set between an upper die and a lower die of a transfer mold device, sealing resin is filled in a cavity formed between the upper and lower dies, and the filled sealing resin is thermally cured. Consequently, the wiring board suffers from deformation (distortion) due to a thermal expansion of the wiring board resulting from heating during the molding of the sealant and due to stress produced when the wiring board is clamped between the upper and lower dies, and the like. As a result, internal stress remains in the wiring board, causing deformation of the wiring board and respective device formation areas (divided semiconductor devices) after molding. More specifically, the wiring board and semiconductor devices are warped, and variation of the warpage is large. When a semiconductor device has large warpage, the reliability of secondary mounting is degraded. Specifically, in the secondary mounting for mounting a semiconductor device on a mounting board, the favorable bump connections are not provided. Also, when a semiconductor device is mounted on another semiconductor device as in PoP (Package on Package) configuration, the semiconductor devices can fail to provide satisfactory bump connections.

JP-2000-124163A discloses technologies for forming a slit-shaped throughholes through a board along lines which partition a plurality of device mounting areas (equivalent to the above-mentioned device formation areas) before the device mounting areas which are mounted with semiconductor devices are collectively sealed with resin. According to JP-2000-124163A, the throughholes act to distribute internal stress which occurs when the board is sealed with the resin.

Further, JP-2002-76186A and JP-2003-37125A describe technologies for placing a plurality of blocks on which multiple mounting areas are formed on a strip-shaped conductive foil, and forming slits between the respective blocks. According to these publications, the slits act to absorb the stress of the conductive foil which occurs due to a heat treatment in the molding process and the like.

In the technologies disclosed in JP-2000-124163A, the slits are formed on the partitioning lines of the wiring board. However, when the wiring board is sealed with resin, regions outside of the partitioning lines are clamped by molding dies. Then, the highest temperature, and hence the largest thermal expansion is exhibited in the regions which are clamped by the molding dies. Accordingly, the technologies disclosed in JP-2000-124163A fail to sufficiently alleviate stress in the region of the wiring board which exhibits the largest thermal expansion. Further, formation of slits along the partitioning lines means that the slits are formed within the mold region on which the sealant is molded. As such, voids are highly likely to stay within the slits during the molding process. Voids remaining in the slits, if any, can cause a package to be cracked during reflow of semiconductor devices. Moreover, the sealing resin can leak to the back side of the wiring board through the slits and can cover the external terminals.

Neither JP-2002-76186A nor JP-2003-37125 definitely shows the relationship between the molding dies and conductive foil. On the other hand, JP-2002-76186A describes in Paragraph [0037], "frame pattern 66 is used for engagement with a molding die." In view of such a description and the illustration of accompanying FIG. 4B, it is understood that slit 63 between respective blocks 62 is located outside the molding die. Accordingly, like the technologies disclosed in JP-2000-124163A, JP-2002-76186A fails to sufficiently alleviate stress the region of the wiring board which exhibits the largest thermal expansion.

SUMMARY

Slits formed in a region which comes into contact with a molding die alleviate stress due to thermal expansion during sealing of the wiring board, to reduce deformation and distortion of the wiring board.

In one embodiment, there is provided a semiconductor device that includes a plurality of device formation areas each for mounting a semiconductor chip thereon, and two or more slits formed in a region which comes into contact with a molding die when the wiring board is placed in a cavity of the molding die for forming a sealant which collectively covers the plurality of device formation areas.

In another embodiment, the slits are formed in an area which is outside of the mold area on which the sealant is formed and are sandwiched by an upper die and a lower die of the molding dies so as to surround the mold area.

In another embodiment, when the wiring board is placed in the cavity, the slit positioned closer to an air vent of the cavity has an opening area which larger than an opening area of the slit positioned closer to a gate of the cavity.

In another embodiment, the slit which is arranged in the vicinity of a corner of the mold area has a shape that conforms to the shape of the corner.

In another embodiment, at least some of the plurality of slits are opened to the outside on an end surface of the wiring board.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
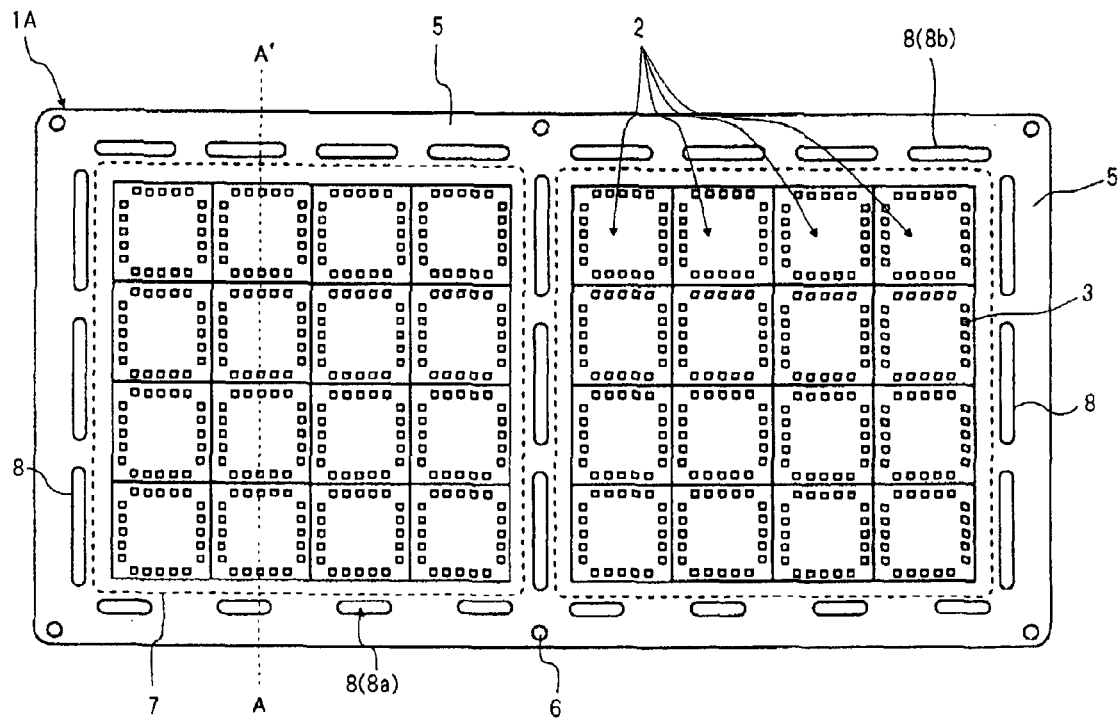
FIG. 1A is a top plan view of a wiring board according to a first embodiment.
Figure 1B:
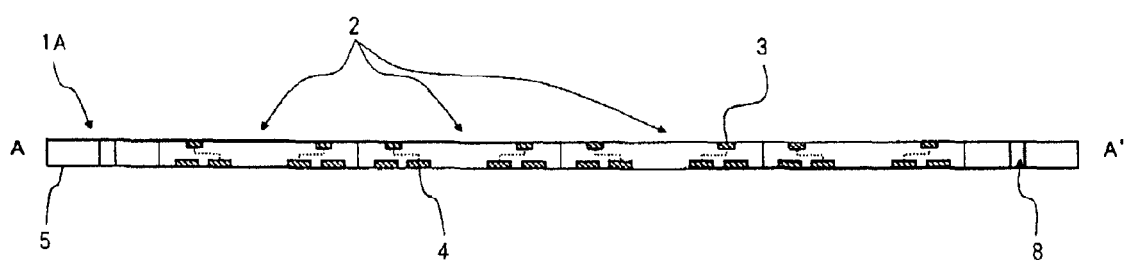
FIG. 1B is a cross-sectional view of the wiring board according to the first embodiment.

Reference is made to FIGS. 1A and 1B. Wiring board 1A according to a first embodiment is a wiring board for use in the manufacturing of a BGA type semiconductor device.

Wiring board 1A is a substantially rectangular glass epoxy wiring board having a 0.14 [mm] thickness. A plurality of device formation areas 2 are defined on the surface of wiring board 1A in a matrix form. Specifically, two sets of device formation areas (hereinafter "zones") are provided, each comprising 4×4 (a total of 16) device formation areas 2. A predetermined wiring pattern (not shown) is formed on each device formation area 2 in each zone. These wires are partially covered with an insulating film (for example, a solder resist). Also, a boundary between respective device formation areas 2 serves as a dicing line for dividing wiring board 1A to singulate each device formation area 2.

A plurality of connection pads 3 are formed on the portions of the wires which are formed on one surface of device formation areas 2 and which are not covered with an insulating film such as a solder resist. A plurality of lands 4 are also formed on the portions of wires which are formed on the other surface of device formation areas 2 and which are not covered with an insulating film such as a solder resist. Then, connection pads 3 and lands 4 corresponding thereto are electrically connected respectively through wires formed internally to wiring board 1A.

Here, the two zones are arranged side by side in the longitudinal direction of wiring board 1A inside of the edges of wiring board 1A. Further, a gap is provided between the two adjacent zones. As a result, frame-shaped perimeters (hereinafter called "frame 5") exist around the two zones. Frames 5 are provided with positioning holes 6 at predetermined intervals. These positioning holes 6 are utilized for transportation and positioning of wiring board 1A.

Further, a plurality of slits 8 are formed at predetermined positions of frames 5 through wiring board 1A. In this embodiment, a plurality of slits 8 are formed around mold areas 7 in which a sealant is formed to collectively cover these areas. Stated another way, a plurality of slits 8 are positioned inside of the edges of wiring board 1A but outside of the edges of mold areas 7. The plurality of slits 8 are further positioned along each side of mold areas 7. Each slit 8 has a width of approximately 1 [mm]. Also, each slit 8 is spaced apart from the edge of mold area 7 by 1-2 [mm] and spaced apart from the edge of wiring board 1A by 1 [mm] or more. Further, slits which are adjacent in the longitudinal direction are spaced apart from each other by approximately 1-3 [mm]. Gaps between adjacent slits are utilized as adsorption points during transportation of wiring board 1A.

As will be later described in detail, a semiconductor chip is mounted on each device formation area 2 of wiring board 1A, and a plurality of device formation areas 2 mounted with semiconductor chips are collectively covered with a sealant. Specifically, wiring board 1A mounted with a semiconductor chip on each device formation area 2 is placed in a cavity of the molding dies comprised of an upper molding die and a lower molding die, and a melted sealing resin is filled into the cavity from a gate of the cavity to form a sealant. In this event, among a plurality of slits 8 formed through wiring board 1A, those slits 8a which are positioned closer to the gate of the cavity, when wiring board 1A is placed in the cavity of the molding dies, are positioned to circumvent the position of the gate. Further, the interval between adjacent slits 8a is wider than the interval between other slits 8. This is intended to avoid a leak of the sealing resin through slits 8a by positioning slits 8a to circumvent the position of the gate. Further, slits 8b positioned closer to an air vent of the molding dies have a larger opening area than the opening area of slits 8a which are positioned closer to the gate. This is intended to prevent stress on the air vent side of wiring board 1A from being larger than stress on the gate side thereof due to pressure against wiring board 1A caused by injection of the sealant resin.

Next, a description will be given of a method of manufacturing a BGA type semiconductor device using wiring board 1A.

Figure 2A:
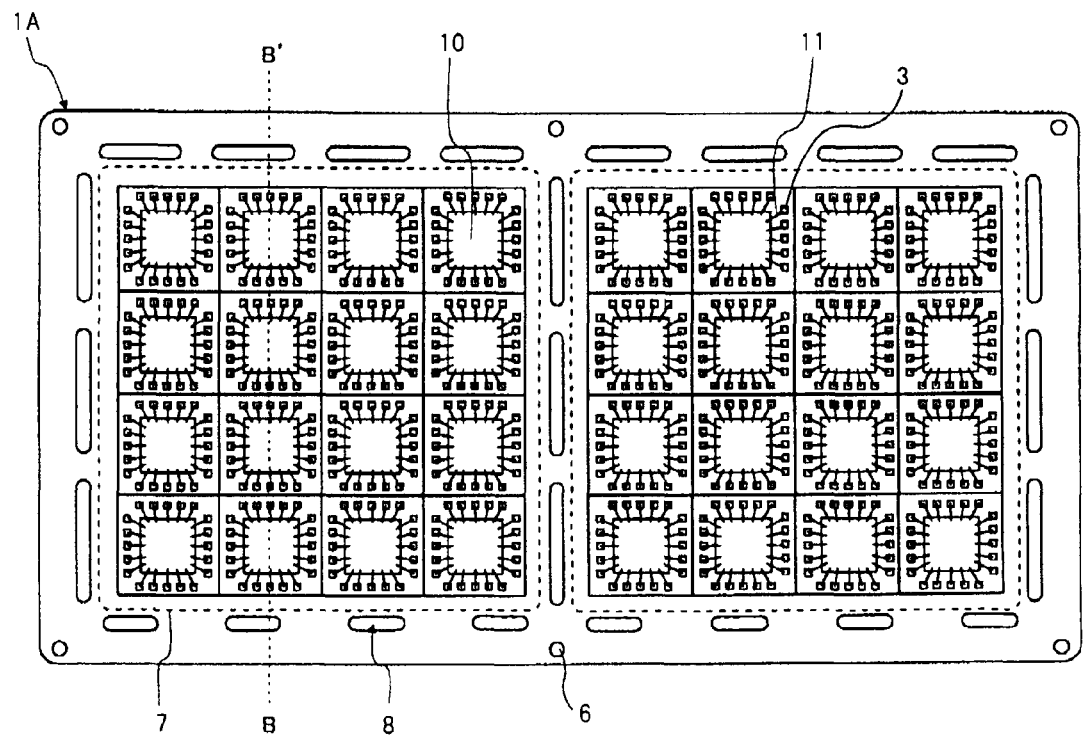
FIG. 2A is a top plan view of a wiring board after a wire bonding process has been completed.
Figure 2B:
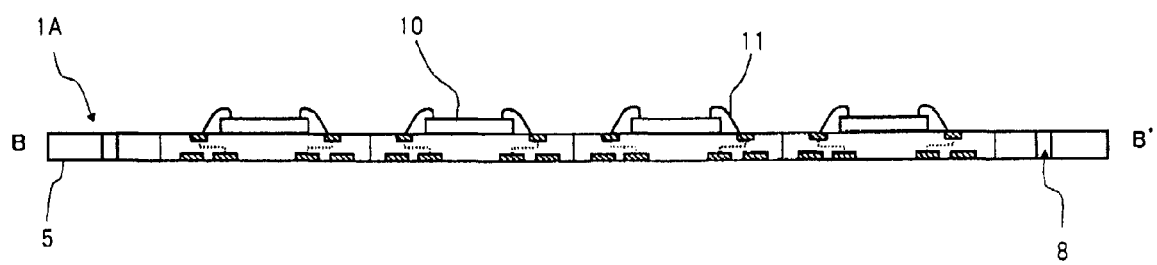
FIG. 2B is a cross-sectional view of the wiring board after the wire bonding process has been completed.

First, wiring board 1A shown in FIGS. 1A and 1B is prepared. Next, a die bonding process is executed. Specifically, semiconductor chip 10 is mounted on each device formation area 2 (FIG. 1A) of wiring board 1A, as shown in FIGS. 2A and 2B. Semiconductor chip 10 comprises an Si substrate which is formed with a logic circuit, a storage circuit or the like on a surface thereof. A plurality of electrode pads are formed along the peripheral edges of the Si substrate. Additionally, a passivation film is formed on regions of the Si substrate, which are not formed with electrode pads, for protecting a circuit forming surface. In the die bonding process, the back surface of semiconductor chip 10 (surface opposite to the surface formed with the electrode pads) is securely adhered around the center of each device formation area 2 (FIG. 1A) of wiring board 1A through an insulative bonding agent, DAF (Die Attached Film) or the like using a die bonding device, not shown. After semiconductor chips 10 have been mounted on all device formation areas 2, the method proceeds to a wire boding process.

In the wire bonding process, the electrode pads formed on the surface of semiconductor chip 10 are connected to connection pads 3 of device formation area 2, corresponding thereto, through conductive wires 11. Such wires 11 are made of, for example, Au, Cu or the like. Also, a wire bonding device, not shown, is used in the wire bonding process. Specifically, after ultrasonically thermo-compression bonding one end of wire 11, formed with a ball through welding, onto an electrode pad of semiconductor chip 10, the other end of wire 11 is ultrasonically thermo-compression bonded to corresponding connection pad 3 on wiring board 1A. Notably, wire 311 is formed to draw a predetermined loop shape in order to avoid interference with the corner of semiconductor chip 10. FIGS. 2A, 2B show a state of wiring board 1A after wires 11 have been connected to all device formation areas 2. More specifically, FIG. 2A is a top plan view of wiring board 1A after the wire bonding process has been completed, while FIG. 2B is a cross-sectional view taken along B-B' in FIG. 2A. Wiring board 1A, which has been processed to appear as shown in FIGS. 2A, 2B, is transferred to a sealing process.

FIGS. 3(a)-3(d) are cross-sectional views showing the sealing process. A transfer mold device (mold device 20) used in the sealing process comprises the molding dies made up of upper molding die 21 and lower molding die 22. Upper molding die 21 is formed with cavity 23, while lower molding die 22 is formed with recess 24 for placing wiring board 1A therein. Cavity 23 is compatible with the MAP technique. Specifically, within cavity 23, a sealant is formed on mold areas 7 (FIGS. 1A, 2A) of wiring board 1A to collectively cover a plurality of device formation areas 2. In this embodiment, since two divided mold areas 7 are defined on wiring board 1A, cavity 23 is also divided into two. Notably, the division of mold areas 7 results in alleviated warpage of wiring board 1A after sealing.

Figure 3:
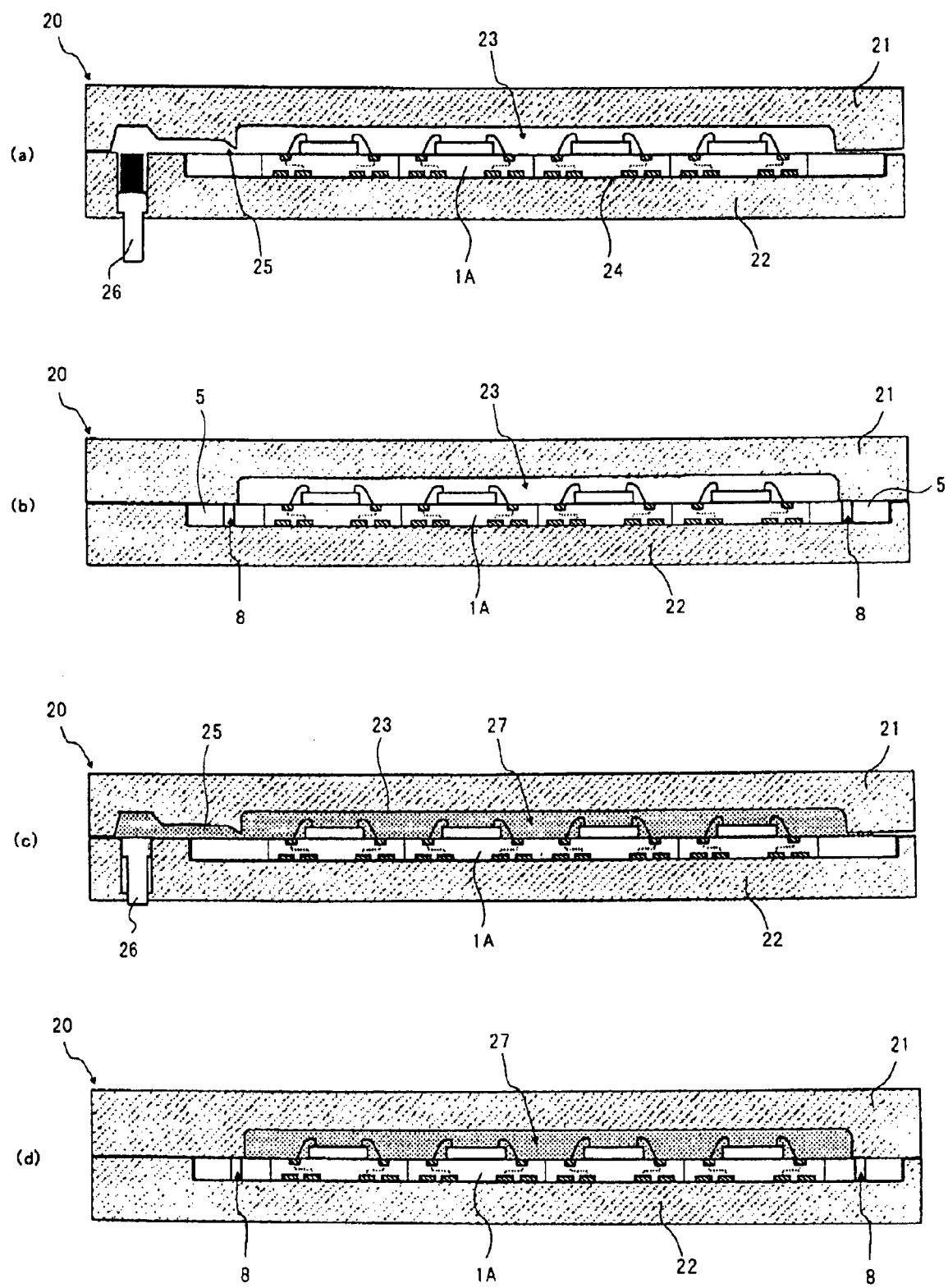
FIGS. 3(a)-3(d) are cross-sectional views showing a sealing process.

When the wire bonding process is completed, wiring board 1A is set in recess 24 of molding die 22, as shown in FIGS. 3(a), 3(b). Then, upper molding die 21 is placed on lower molding die 22 in which wiring board 1A is set. As upper molding die 21 is placed on lower molding die 22, cavity 23 of a predetermined size and gate 25 are formed on wiring board 1A. In this event, wiring board 1A is set such that slits 8a shown in FIG. 1A are positioned closer to a gate, and slits 8b are positioned closer to an air vent.

As shown in FIG. 3(b), when wiring board 1A is set in the molding dies, cavity 23 is formed approximately 1 [mm] inside of slits 8. Thus, frame 5 of wiring board 1A including slits 8 is clamped by upper molding die 21 and lower molding die 22. Stated another way, slits 8 are positioned in a region which is clamped by upper molding die 21 and lower molding die 22.

Mold device 20 comprises a heating mechanism, not shown, by which upper molding die 21 and lower molding die 22 are heated to a predetermined temperature (for example, 180 degrees). Therefore, wiring board 1A clamped by upper molding die 21 and lower molding die 22 is also heated to the predetermined temperature (for example, 180 degrees). Here, frame 5 of wiring board 1A is heated to the highest temperature and exhibits a large thermal expansion because frame 5 is directly in contact with upper molding die 21 and lower molding die 22. However, frame 5 of wiring board 1A is formed with a plurality of slits 8 which alleviate deformation of wiring board 1A possibly caused by the thermal expansion and clamping of the molding dies.

Subsequently, tablets of thermosetting sealing resin (for example, epoxy resin) are supplied into a pot of lower molding die 22, and the supplied sealing resin is melted by heating. Next, as shown in FIG. 3(c), the melted sealing resin is injected from gate 25 into cavity 23 by plunger 26. After sealing resin 27 is filled in cavity 23, sealing resin 27 is cured at a predetermined temperature (for example, 180 degrees) to form a sealant. In this embodiment, since slits 8 are positioned approximately 1 [mm] outside of cavity 23, sealing resin 27 will not leak from cavity 23 to slits 8, as shown in FIG. 3(d). As well, since slits 8a shown in FIG. 1A are positioned to circumvent the gate position, sealing resin 27 will also not leak to slit 8a. Further, since slits 8b closer to the air vent have a larger opening area than slits 8a closer to the gate, stress on the air vent side of wiring board 1A is avoided from being larger than stress on the gate side thereof due to pressure applied to wiring board 1A caused by the injection of sealing resin 27.

Figure 4A:
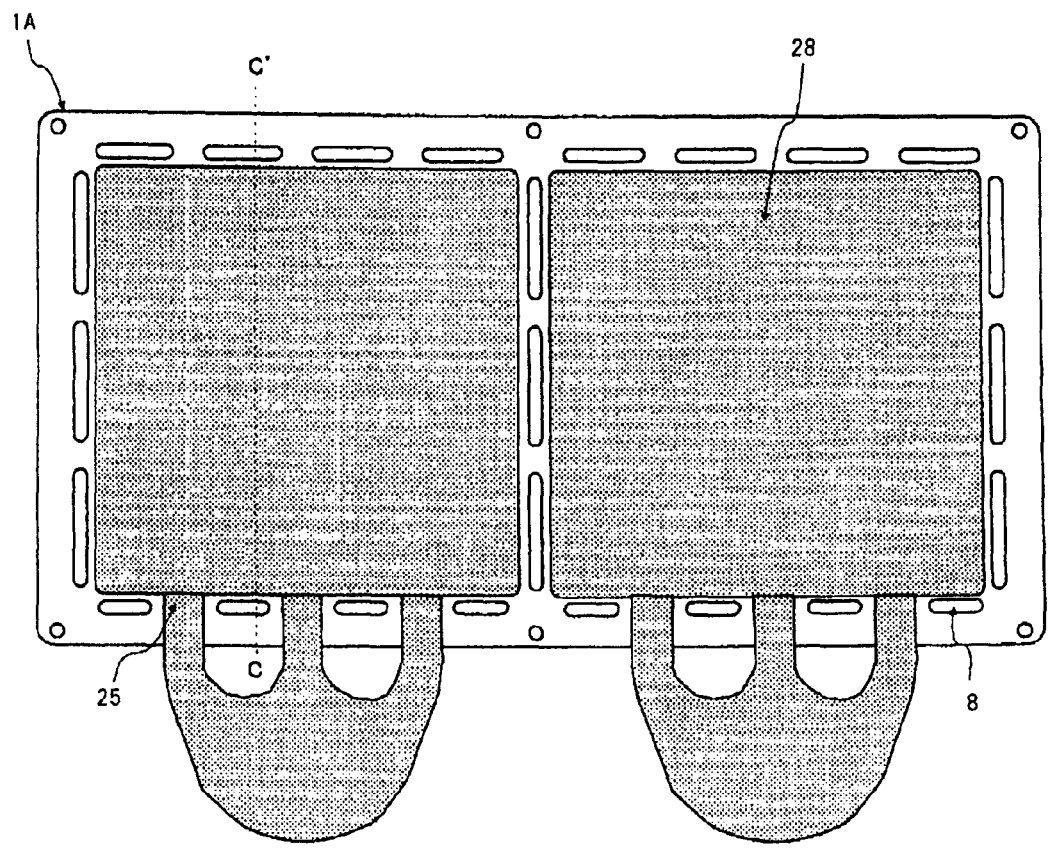
FIG. 4A is a top plan view of a wiring board which is formed with a sealant in two areas, respectively.
Figure 4B:
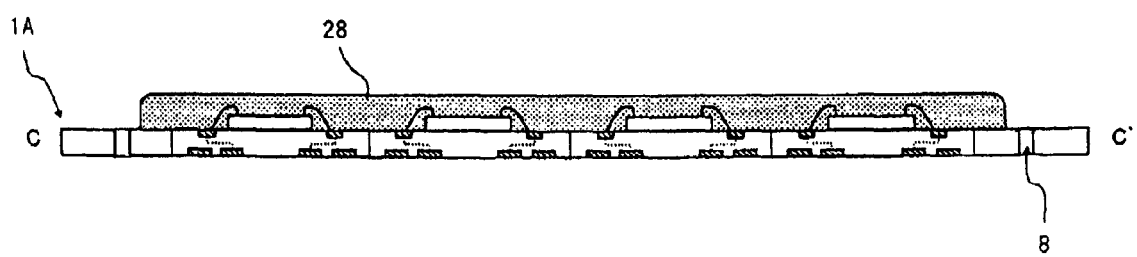
FIG. 4B is a cross-sectional view of the wiring board which is formed with the sealant in the two areas, respectively.

Subsequently, wiring board 1A is removed from the molding dies, and baked at a predetermined temperature (for example, 180° C.) to completely cure the sealants. In this way, sealants 28 are formed over the two zones on wing board 1A to collectively cover each zone, as shown in FIGS. 4A, 4B. Also, unnecessary portions such as runner, cull and the like are removed from sealants 28.

Figure 5A:
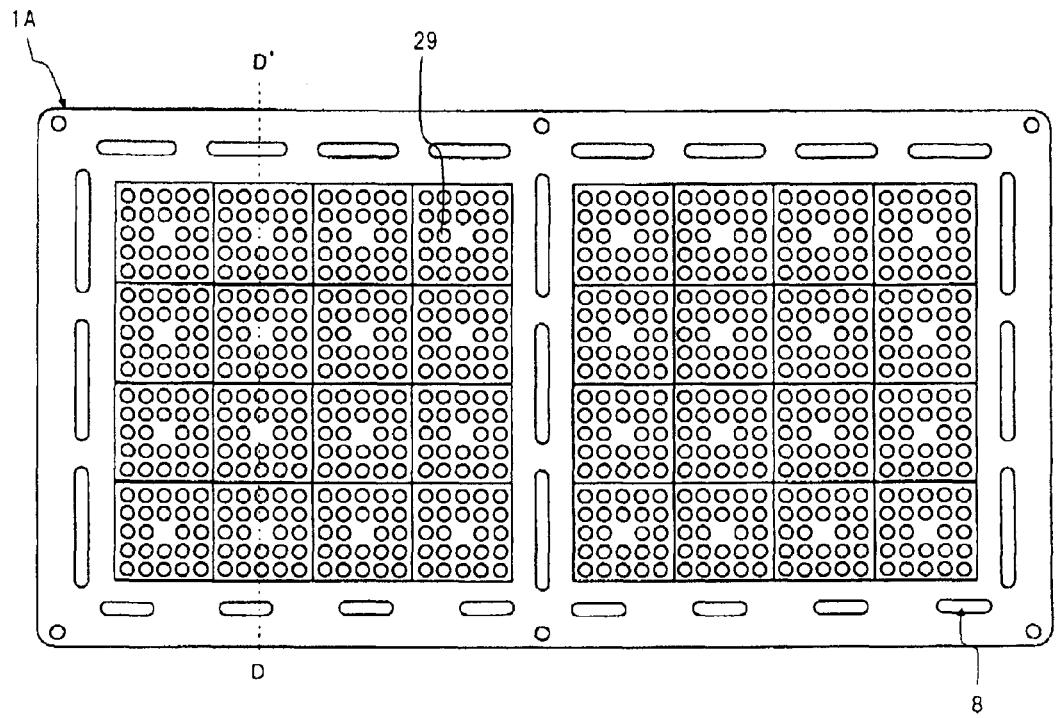
FIG. 5A is a top plan view of the wiring board after a ball mount forming process has been completed.
Figure 5B:
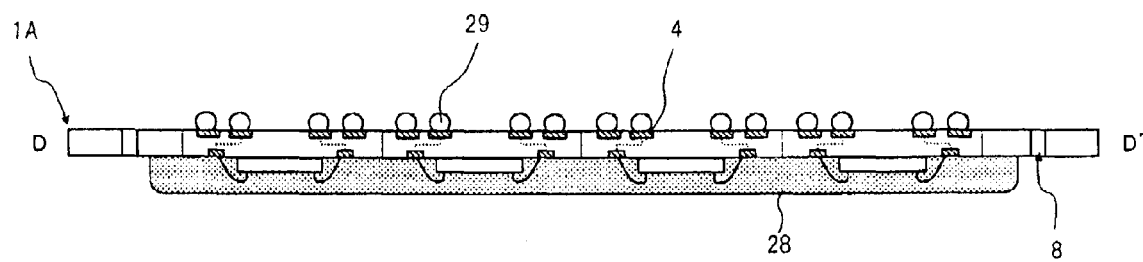
FIG. 5B is a cross-sectional view of the wiring board after the ball mount forming process has been completed.

Next, the method proceeds to a ball mount process. Specifically, as shown in FIGS. 5A, 5B, conductive solder balls 29 are placed on a plurality of lands 4 arranged in a lattice shape on the back surface of wiring board 1A to form bump electrodes which serve as external terminals. The ball mount process employs a ball mounter, not shown, which has a plurality of adsorption holes formed in correspondence with the positions of lands 4 on wiring board 1A. For example, a plurality of solder balls 29 are held in the respective adsorption holes, and held solder balls 29 are collectively placed onto lands 4 on wiring board 1A through flux.

After solder balls 29 have been placed onto all device formation areas 2, wiring board 1A is reflowed to form bump electrodes (external terminals). In this embodiment, two divided sealants 28 are formed on wiring board 1A, and a plurality of slits 8 are arranged to surround mold areas 7, thereby reducing the warpage of wiring board 1A after sealing with resin. Consequently, solder balls 29 can be placed in a satisfactory manner.

Figure 6A:
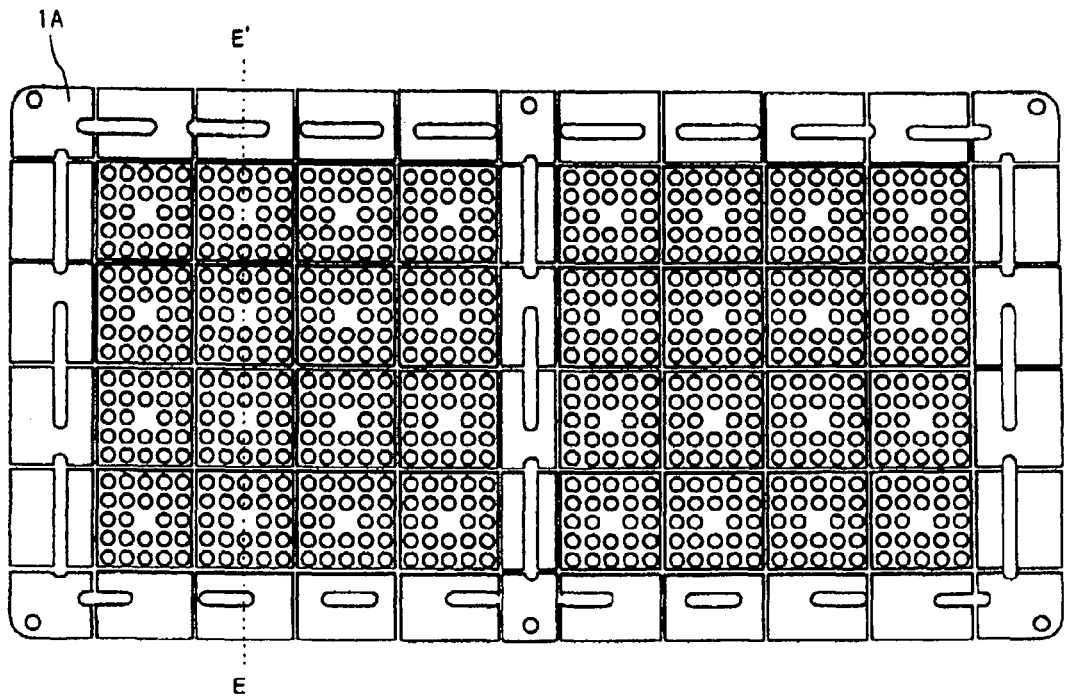
FIG. 6A is a top plan view of the wiring board in a board dicing process.
Figure 6B:
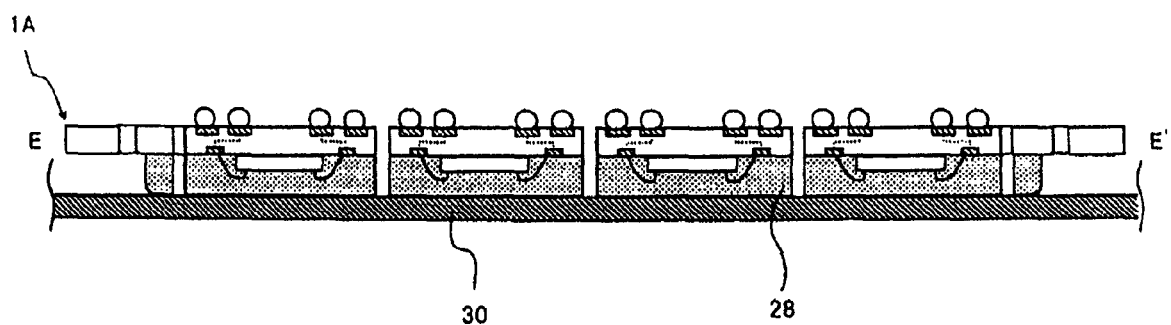
FIG. 6B is a cross-sectional view of the wiring board in the board dicing process.
Figure 7:
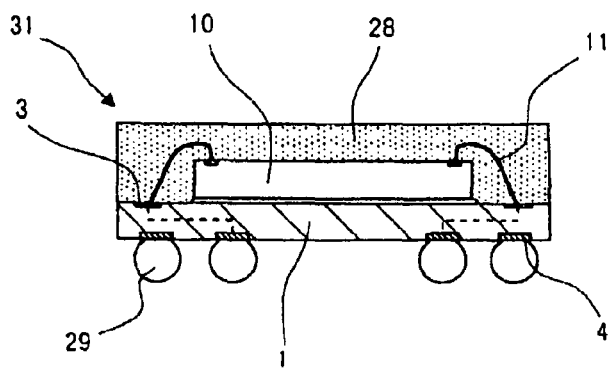
FIG. 7 is a cross-sectional view of a manufactured semiconductor device.

Next, the method proceeds to a board dicing process. Specifically, as shown in FIGS. 6A, 6B, wiring board 1A is cut along dicing lines to separate respective device formation areas 2. In the board dicing process, sealants 28 are adhered on dicing tape 30 to support wiring board 1A. Subsequently, wiring board 1A is cut vertically and horizontally by a dicing blade of a dicing device, not shown, to separate respective device formation areas 2 one by one. Each separated device formation area 2 is picked up from dicing tape 30, and then semiconductor device (package) 31 as shown in FIG. 7 is provided.

In this embodiment, since wiring board 1A is reduced in warpage after it has been sealed with resin, wiring board 1A can be cut with high accuracy.

Also, a plurality of slits 8, disposed at positions at which wiring board 1A is clamped, alleviate deformation of wiring board 1A caused by thermal expansion of wiring board 1A due to heating during the sealing process (where the resin is molded), and caused by the clamping of wiring board 1A with the upper and lower molding dies. Consequently, no deformation of the board will remain within the package as internal stress, so that packages are less varied in warpage. Further, since packages suffer from less warpage, reliability is increased for secondary mounting of the packages to mounting boards or to other semiconductor devices.

Second Embodiment

Figure 8:
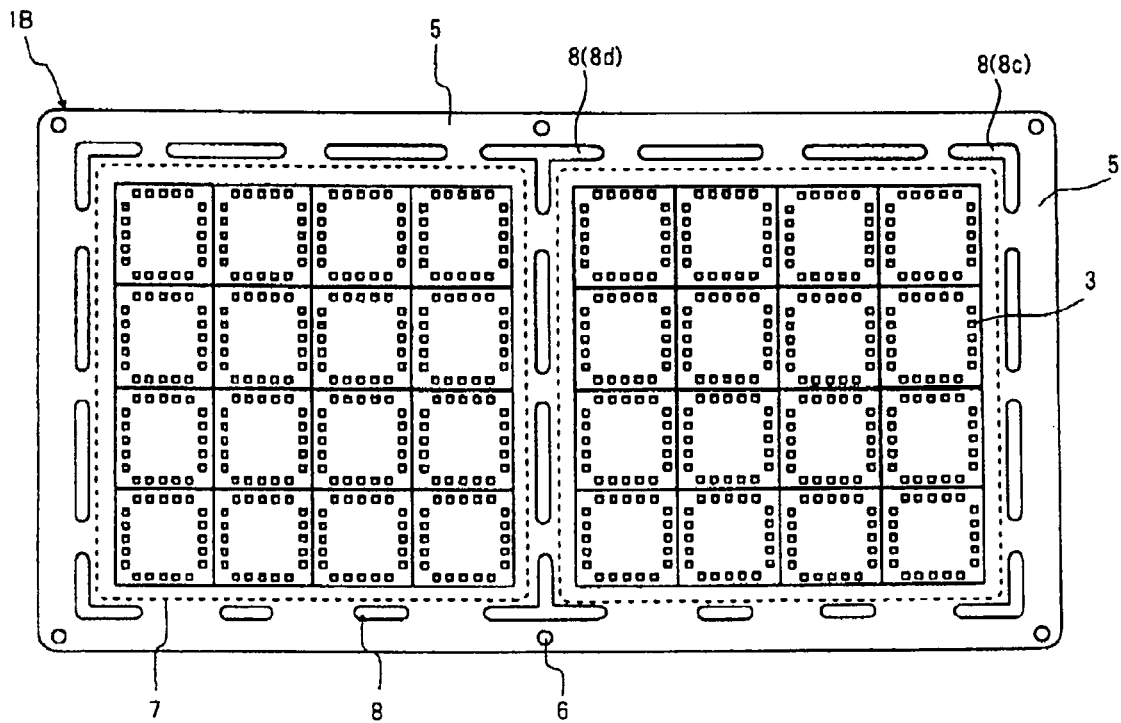
FIG. 8 is a top plan view of a wiring board according to a second embodiment.

FIG. 8 is a top plan view of wiring board 1B according to a second embodiment.

Wiring board 1B shown in FIG. 8 is identical in basic configuration to wiring board 1A according to the first embodiment. Wiring board 1B according to the second embodiment differs from wiring board 1A according to the first embodiment in the shape of slits 8 positioned in the vicinity of corners of mold areas 7. Specifically, in wiring board 1B according to this embodiment, slits 8 positioned in the vicinity of corners of mold areas 7 have shapes that conform to the shape of the corners. More specifically, wiring board 1B is formed with L-shaped slits 8c and T-shaped slits 8d in the vicinity of the corners of mold areas 7.

Figure 9A:
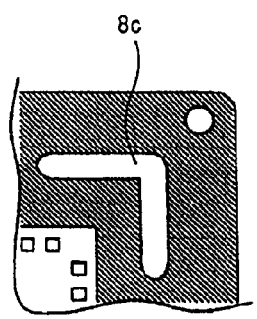
FIG. 9A is an enlarged view of slit 8c at room temperature.
Figure 9B:
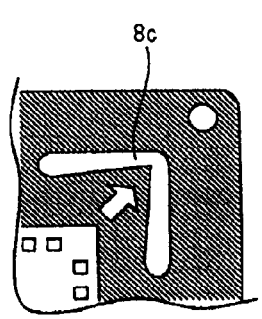
FIG. 9B is an enlarged view of slit 8c during the sealing process.

According to the second embodiment, wiring board 1B provides similar advantages to those of wiring board 1A according to the first embodiment. Further, while stress concentrates on the corners of mold areas 7 in the X and Y directions, wiring board 1B according to this embodiment is satisfactorily freed from the stress by the action of slits 8 (8c, 8d) formed along the corners in shapes that conform to the corners. FIG. 9A shows how slit 8c appears at room temperature, and FIG. 9B shows how slit 8c appears during the sealing process (where wiring board 1B is clamped). As shown in FIG. 9B, stress concentrates in the X and Y directions during the sealing process, but the stress is satisfactorily absorbed through deformation of slit 8c.

Third Embodiment

Figure 10:
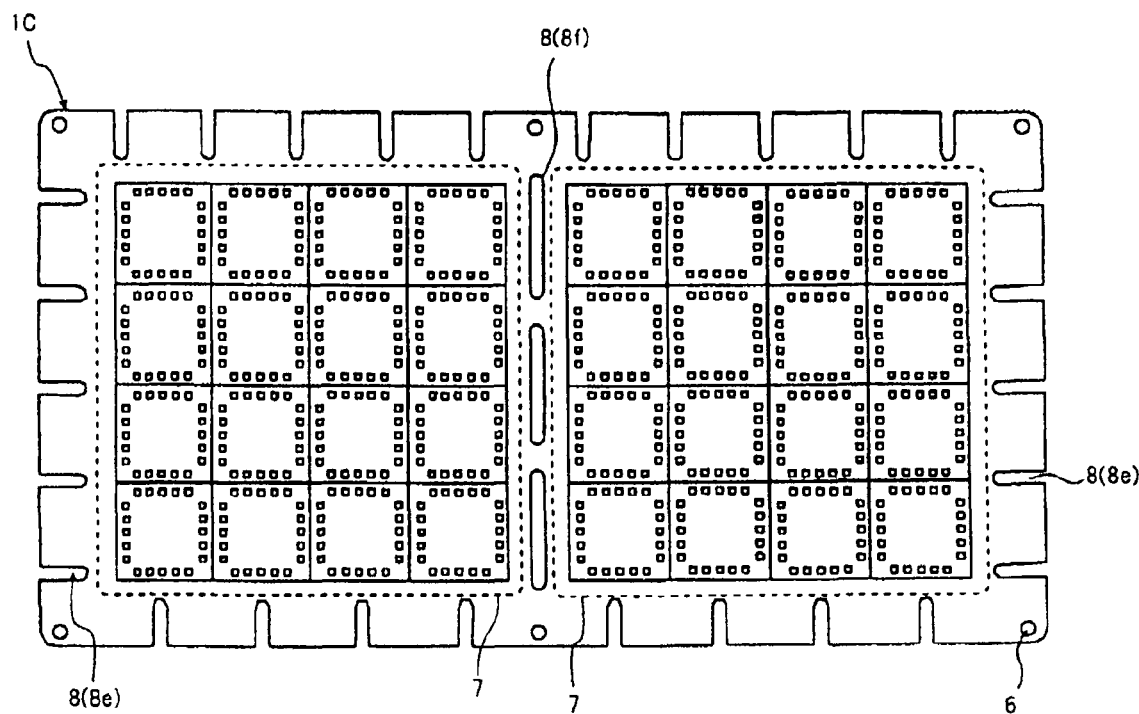
FIG. 10 is a top plan view of a wiring board according to a third embodiment.

FIG. 10 is a top plan view of wiring board 1C according to a third embodiment.

Figure 11A:
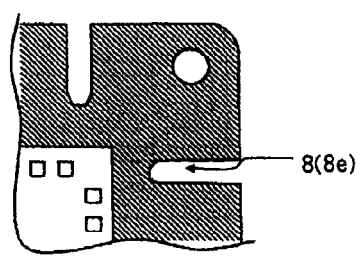
FIG. 11A is an enlarged view of slit 8e at room temperature.
Figure 11B:
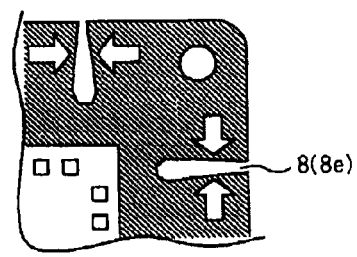
FIG. 11B is an enlarged view of slit 8c during the sealing process.

Wiring board 1C shown in FIG. 10 is identical in basic configuration to wiring board 1A according to the first embodiment. Wiring board 1C according to the third embodiment differs from wiring board 1A according to the first embodiment in that at least some of a plurality of slits 8 are opened. Specifically, a plurality of slits 8e are positioned in peripheral edges of wiring board 1C along each side of board 1C. Each slit 8e has its longitudinal end communicate with the end surface of wiring board 1C and is opened. On the other hand, slits 8f positioned between two mold areas 7 are not opened. Open slits 8e are more susceptible to deformations, as compared with closed slits 8f. Accordingly, wiring board 1C of this embodiment is more satisfactorily freed from stress caused by clamping wiring board 1C during the sealing process (where the resin is molded) by the action of a plurality of opened slits 8e formed therethrough. FIG. 11A shows how slit 8e appears at room temperature, and FIG. 11B shows how slit 8e appears during the sealing process (where wiring board 1B is clamped). As shown in FIG. 11B, slits 8e are susceptible to deformation particularly inwardly in its width direction, and therefore effectively absorbs stress during the sealing process.

Fourth Embodiment

Figure 12:
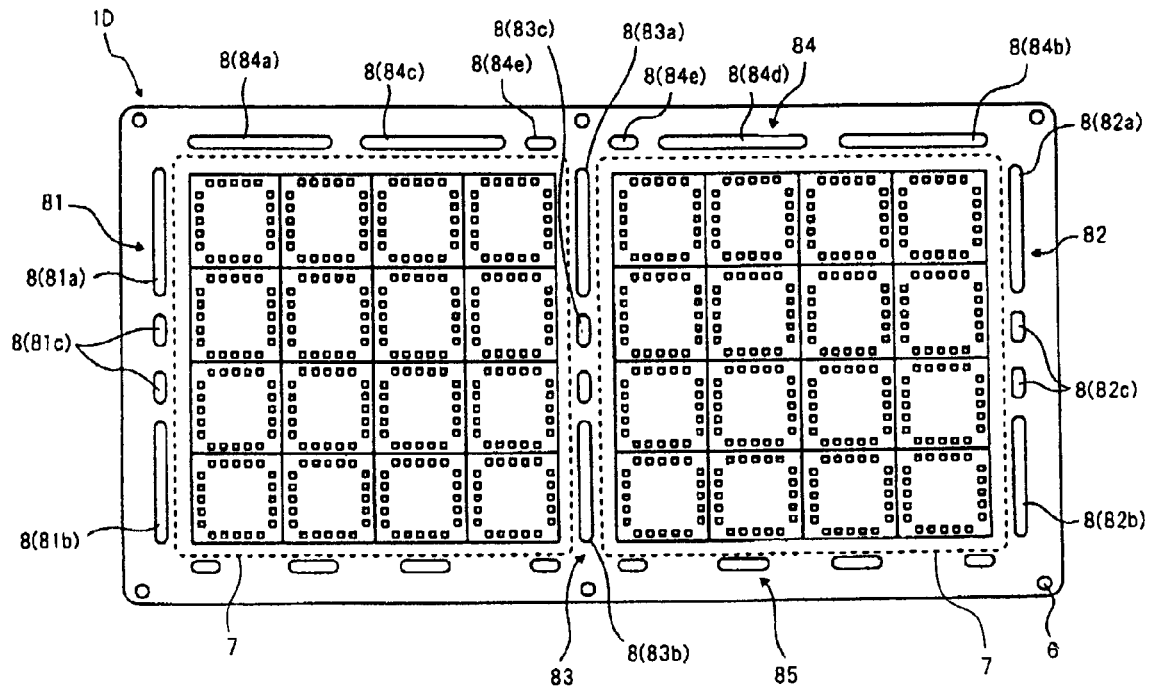
FIG. 12 is a top plan view of a wiring board according to a fourth embodiment.

FIG. 12 is a top plan view of wiring board 1D according to a fourth embodiment.

Wiring board 1D shown in FIG. 12 is identical in basic configuration to wiring board 1A according to the first embodiment. Wiring board 1D according to the fourth embodiment differs from wiring board 1A according to the first embodiment in the following aspects. Specifically, wiring board 1D is formed with a first series of slits 81 in the vicinity of one shorter side, and with a second series of slits 82 in the vicinity of the other shorter side. The first series of slits 81 and second series of slits 82 comprise a plurality of slits 8 arranged along the respective shorter sides. Also, between two mold areas 7, a third series of slits 83 is formed in the same configuration as the first and second series of slits 81, 82 in parallel with the first and second series of slits 81, 82. Further, a fourth series of slits 84 is formed in the vicinity of one longer side of wiring board 1D, and a fifth series of slits 85 is formed in the vicinity of the other longer side. The fourth series of slits 84 and fifth series of slits 85 comprise a plurality of slits 8 arranged along the respective longer sizes. In the first through fourth series of slits 81-84, slits 8 positioned at both ends of each series have a length longer than that of other slits 8. Specifically, in the first series of slits 81, slits 81a, 81b positioned at both ends thereof have a length longer than that of slits 81c which are positioned between these slits 81a, 81b. Similarly, in the second series of slits 82, slits 82a, 82b positioned at both ends thereof have a length longer than that of slits 82c which are positioned between these slits 82a, 82b. In the third series of slits 83, slits 83a, 83b positioned at both ends thereof have a length longer than that of slits 83c which are positioned between these slits 83a, 83b.

Also, in the fourth series of slits 84, slits 84a, 84b positioned at both ends thereof, and slits 84c, 84d positioned inside of these slits 84a, 84b have a length longer than that of slits 84e positioned between slits 84c, 84d. Notably, the fourth series of slits 84 is positioned closer to the air vent of the cavity when wiring board 1D is placed in the cavity of the molding dies. The length of slits 84c, 84d may be larger or smaller than that of slits 84a, 84b, and, for example, may have the same length as slit 84e.

According to the fourth embodiment, wiring board 1D provides similar advantages to those of wiring board 1A according to the first embodiment. Further, during the sealing process (where the resin is molded), wiring board 1D suffers from a larger thermal expansion in a peripheral area than in a central area. Thus, wiring board 1D is more satisfactorily freed from stress due to thermal expansion of wiring board 1D and thermal expansion of the peripheral area due to the clamping, during the sealing process (where the resin is molded), by the action of slits 8 positioned at the ends of each side of wiring board 1D, which are formed longer (larger) than slits 8 positioned in a central region of each side.

Fifth Embodiment

Figure 13:
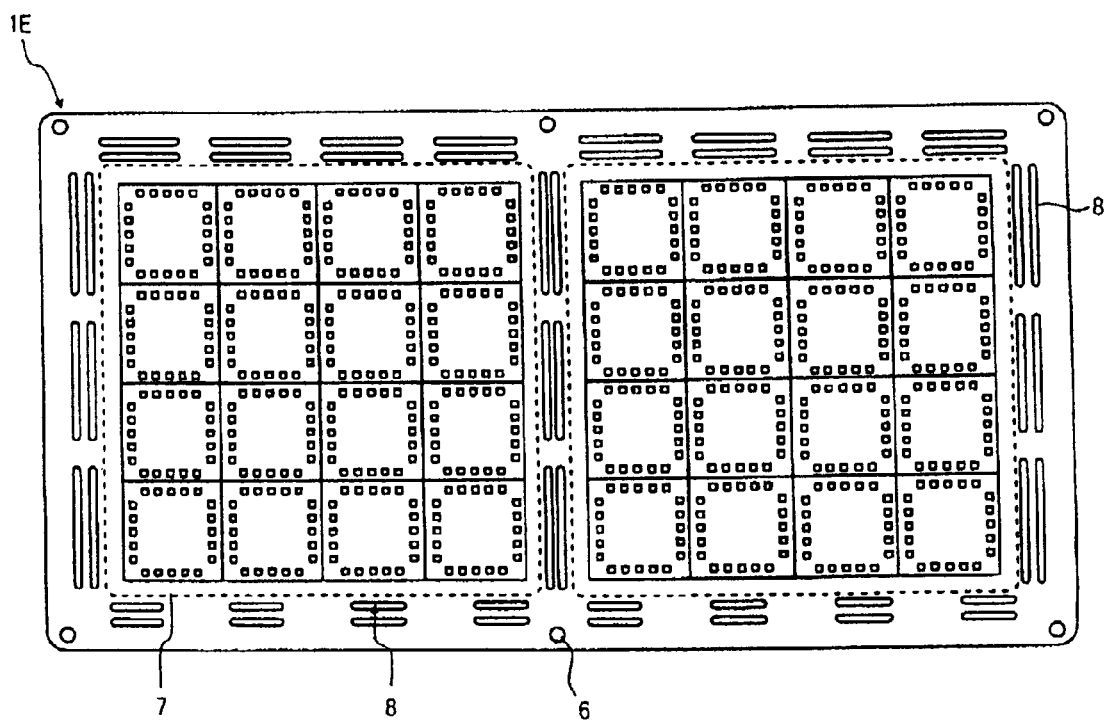
FIG. 13 is a top plan view of a wiring board according to a fifth embodiment.

FIG. 13 is a top plan view of wiring board 1E according to a fifth embodiment.

Wiring board 1E shown in FIG. 13 is identical in basic configuration to wiring board 1 according to the first embodiment. Wiring board 1E according to the fifth embodiment differs from wiring board 1A according to the first embodiment in that two series of slits are formed along each side of board 1E.

According to the fifth embodiment, wiring board 1E provides similar advantages to those of wiring board 1A according to the first embodiment, and is more satisfactorily freed from the stress caused by clamping wiring board 1E during the sealing process (where the resin is molded).

Sixth Embodiment

Figure 14:
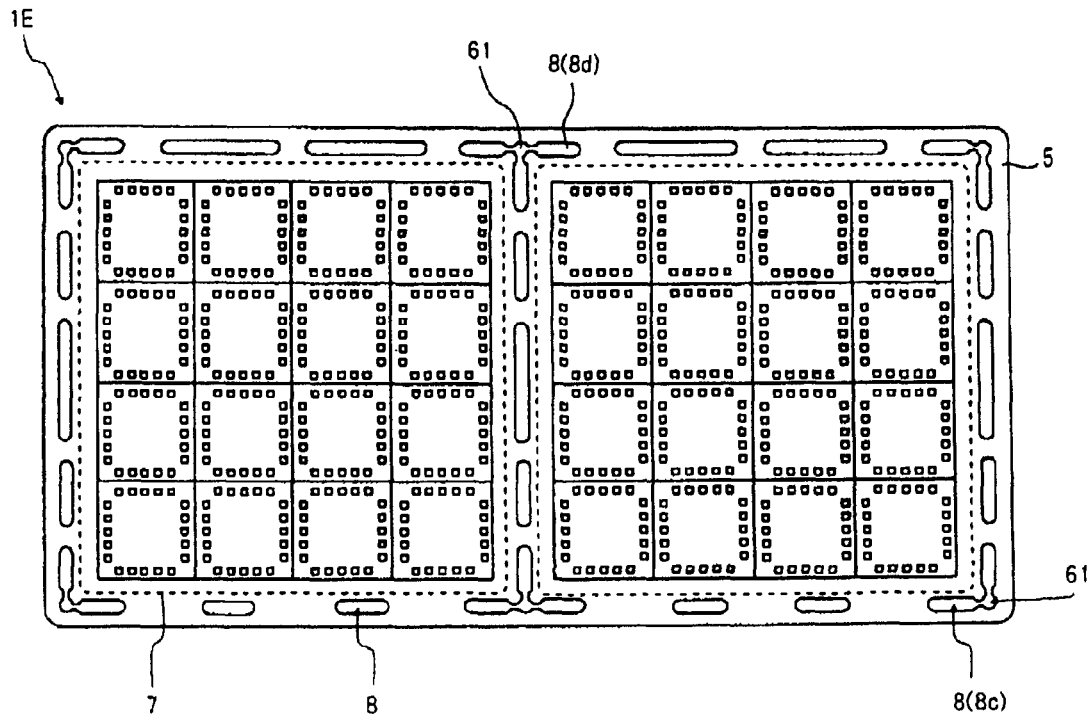
FIG. 14 is a top plan view of a wiring board according to a sixth embodiment.

FIG. 14 is a top plan view of wiring board 1F according to a sixth embodiment.

Wiring board 1F shown in FIG. 14 is identical in basic configuration to wiring board 1B according to the second embodiment. Wiring board 1F according to the sixth embodiment differs from wiring board 1B according to the second embodiment in that positioning points 61, comparable to positioning holes 6 shown in FIG. 8, are formed in L-shaped slits 8c and T-shaped slits 8d shown in FIG. 8.

According to the sixth embodiment, wiring board 1F provides similar advantages to those of wiring board 1B according to the second embodiment, and can reduce the area of frame 5. In this way, the wiring board can be reduced in size, or the number of device formation areas can be increased. An increase in the number of the device formation areas allows a larger number of products to be produced from one wiring board and reduces the manufacturing cost.

Seventh Embodiment

Figure 15:
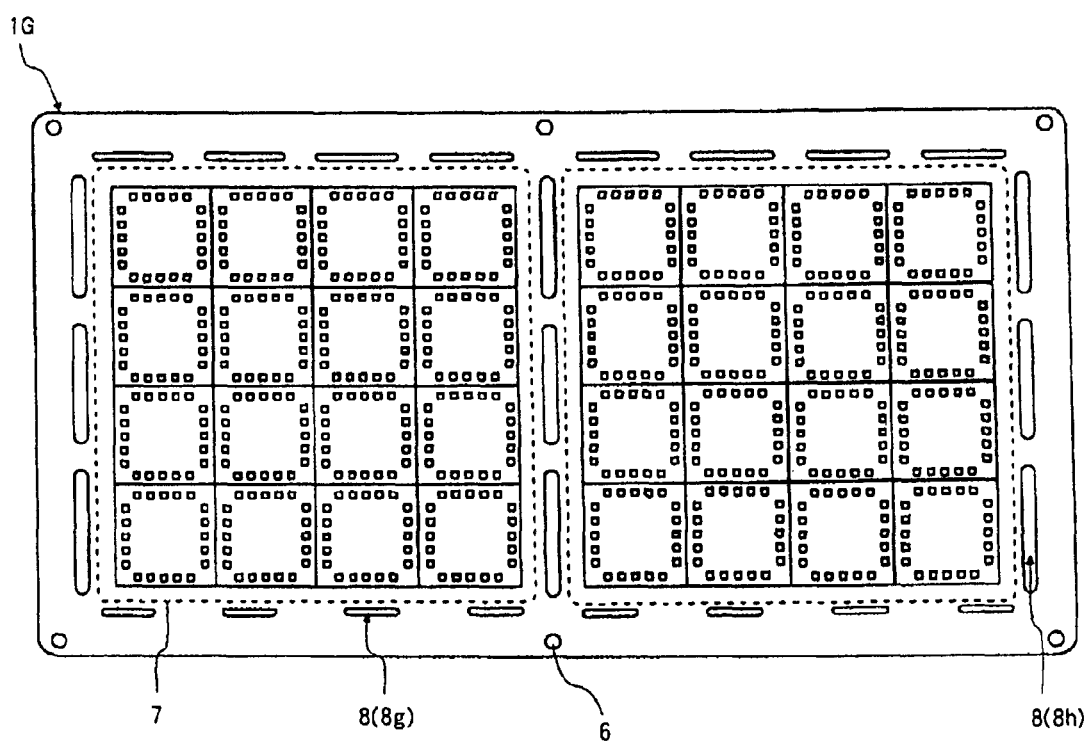
FIG. 15 is a top plan view of a wiring board according to a seventh embodiment.

FIG. 15 is a top plan view of wiring board 1G according to a seventh embodiment.

Wiring board 1G shown in FIG. 15 is identical in basic configuration to wiring board 1A according to the first embodiment. Wiring board 1G according to the seventh embodiment differs from wiring board 1A according to the first embodiment in that it has at least two types of slits 8 which differ in width. Specifically, in wiring board 1G, slits 8h positioned along the shorter sides of board 1G have a larger width than the width of slits 8g positioned along the longer sides of board 1G.

According to the seventh embodiment, wiring board 1G provides similar advantages to those of wiring board 1A according to the first embodiment. Further, the wiring board suffers from a larger thermal expansion on the shorter sides than on the longer sides during the sealing process. Thus, wiring board 1G is more satisfactorily freed from stress due to thermal expansion of wiring board 1G and thermal expansion of the peripheral area due to clamping, during the sealing process (where the resin is molded), by the action of slits 8h positioned along the shorter sides, which have a larger width than slits 8g positioned along the longer sides.

Eighth Embodiment

Figure 16:
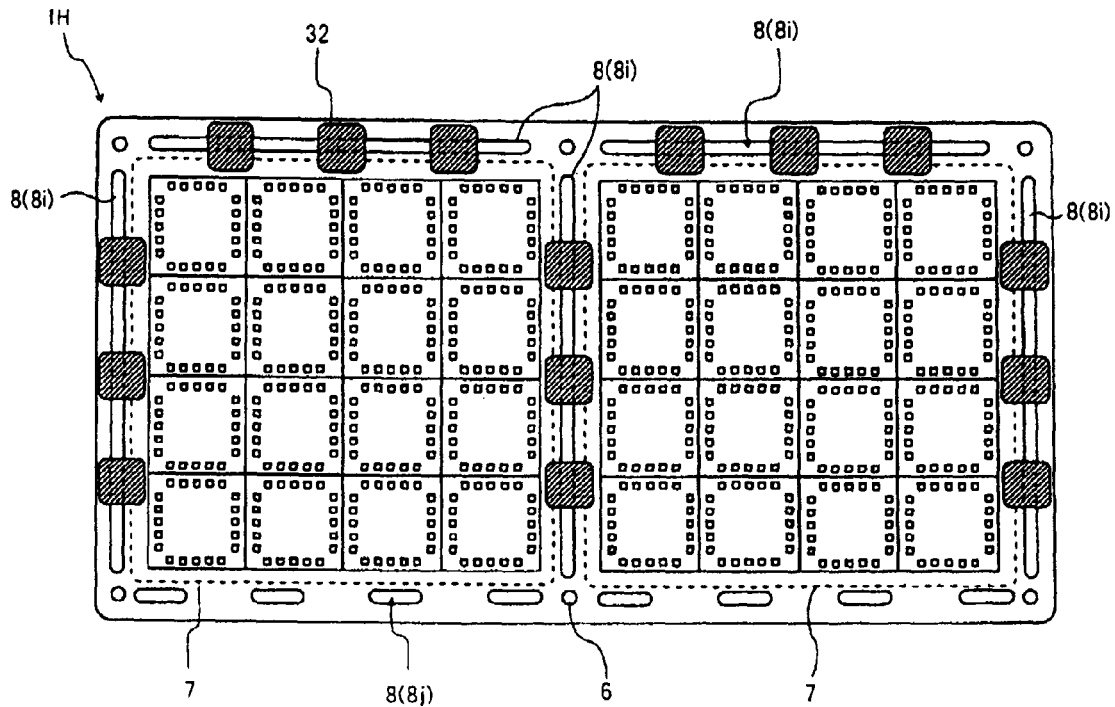
FIG. 16 is a top plan view of a wiring board according to an eighth embodiment.

FIG. 16 is a top plan view of wiring board 1H according to an eighth embodiment.

Wiring board 1H shown in FIG. 16 is identical in basic configuration to wiring board 1A according to the first embodiment. Wiring board 1H according to the eighth embodiment differs from wiring board 1A according to the first embodiment in that slits 8i are formed around mold areas 7 in a length equal to each side of mold area 7. However, slits 8i are formed only in the vicinity of three sides of each mold area 7, while other slits 8j are formed in the vicinity of the remaining side.

Also, sheet members 32 are adhered on each slit 8i. Sheet members 32 are utilized as adsorption sites when wiring board 1H is carried.

Slits 8j have the same shape and dimensions as slits 8a formed through wiring board 1A according to the first embodiment. Slit 8j are positioned closer to the gate of the cavity when wiring board 1H is placed in the cavity of the molding dies.

According to the eighth embodiment, wiring board 1H provides similar advantages to those of wiring board 1A according to the first embodiment.

Further, since slit 8i having a length equal to that of mold areas 7 is divided by adsorption sites 32, a plurality of slits can be arranged around mold areas 7 without actually dividing the slit. Stated another way, slits having a sufficient size as a whole are arranged around mold areas 7.

Ninth Embodiment

Figure 17:
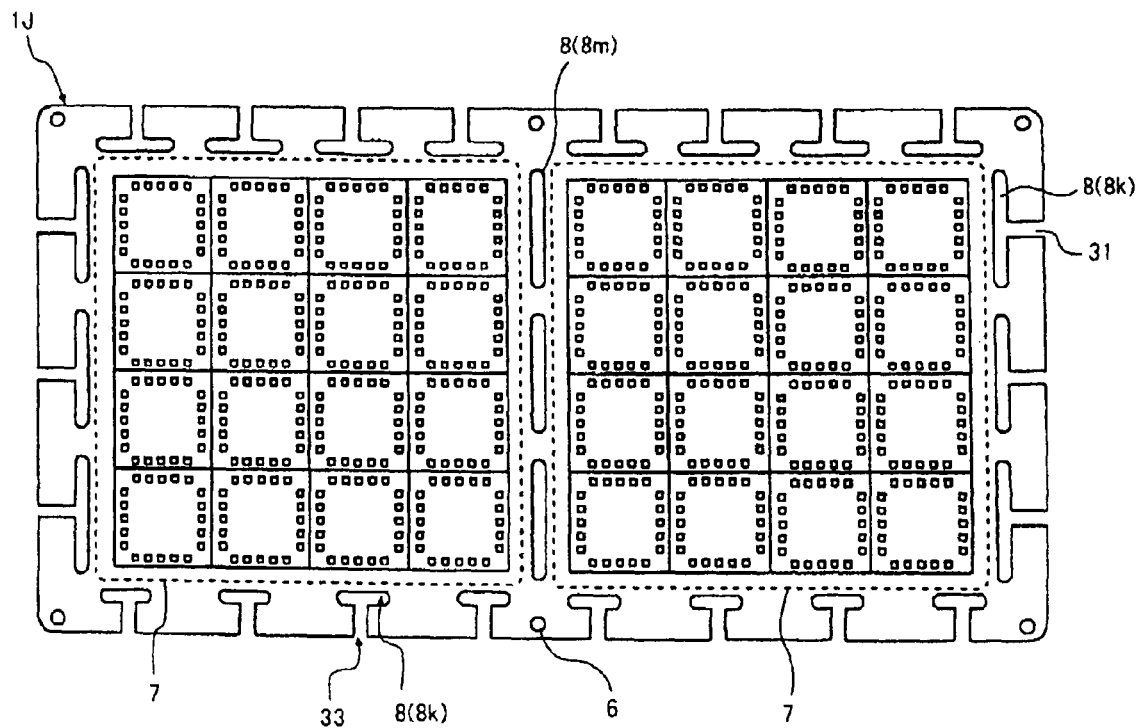
FIG. 17 is a top plan view of a wiring board according to a ninth embodiment.

FIG. 17 is a top plan view showing wiring board 1J according to a ninth embodiment.

Wiring board 1J shown in FIG. 17 is identical in basic configuration to wiring board 1A according to the first embodiment. Wiring board 1J according to the ninth embodiment differs from wiring board 1A according to the first embodiment in that a plurality of slits 8 are arranged along the edges of mold areas 7, and at least some of these slits 8 are opened to the end surfaces of wiring board 1J. Specifically, opening 33 extends from each slit 8k positioned between an edge of mold area 7 and an edge of wiring board 1J in a direction orthogonal to the longitudinal direction of these slits 8k, and communicates with the end face of wiring board 1J. Stated another way, each slit 8k is opened through opening 33. Notably, among slits 8 arranged along the edges of mold areas 7, slits 8m positioned between two mold areas 7 are not opened.

Since open slits 8k are more susceptible to deformations, as compared with closed slits 8m, wiring board 1J having such slits 8k is more satisfactorily freed from the stress caused by thermal expansion of wiring board 1J and the thermal expansion of the peripheral area due to the clamping during the sealing process (where the resin is molded). In particular, since slits 8k, which are relatively susceptible to deformation, are arranged around the peripheral area of wiring board 1J, which undergoes large thermal expansion during the sealing process, wiring board 1J is more satisfactorily freed from the stress due to thermal expansion.

A method of manufacturing a semiconductor device using the wiring board according to each of the second through ninth embodiments is similar to the method described in the first embodiment, so that a description thereon is omitted.

In this specification, the present invention has been described in a scenario where the present invention is applied to a semiconductor device which has a single semiconductor chip mounted on a substrate, but the present invention can also be applied to a semiconductor device which comprises a plurality of semiconductor chips arranged side by side or one on another. Further, the present invention can be applied to semiconductor devices other than the BGA type semiconductor device (for example, an LGA type semiconductor device and the like).

Further, while the foregoing description has been given in connection with a semiconductor chip connected to a board by wire bonding, the semiconductor chip may be connected to the board by flip-chip bonding. Also, while the foregoing description has been given in connection with a wiring board made of a glass epoxy base material, the wiring board also includes a flexible wiring board made of a polyimide base material, and the like.

It is apparent that the present invention is not limited to the above embodiments, but may be modified and changed without departing from the scope and spirit of the invention.

What is claimed is:

1. A wiring board comprising:
   a device zone including a plurality of device formation areas;
   a frame including a mold area surrounding the device zone and a clamp area surrounding the mold area, the clamp area including first and second sides opposed to each other, and third and fourth sides opposed to each other, the clamp area to be sandwiched between molding dies when the device zone and the mold area are places in a cavity of the molding dies to form a sealant to collectively cover the device zone and the mold area;
   a plurality of first slits provided adjacent to the first side in the clamp area, each of the first slits including a longitudinal extending along the first side;
   a plurality of second slits provided adjacent to the second side in the clamp area, each of the second slits including a longitudinal extending along the second side;
   a plurality of third slits provided adjacent to the third side in the clamp area, each of the third slits including a longitudinal extending along the third side; and
   a plurality of fourth slits provided adjacent to the fourth side in the clamp area, each of the fourth slits including a longitudinal extending along the fourth side,
   wherein the first, second, third and fourth slits are not filled with the sealant when the device zone and the mold area are sealed with the sealant.

2. The wiring board according the claim 1, wherein the first side of the clamp area is positioned closer to an air vent of the cavity, and the second side of the clamp area is positioned closer to a gate of the cavity when the device zone and the mold area are placed in the cavity of the molding dies.

3. The wiring board according to claim 2, wherein an opening area of the first slits is larger than that of the second slits.

4. The wiring board according to claim 1, further comprising:
   a corner slit provided adjacent to a corner of the mold area in the clamp area of the frame, the corner slit including a shape bending along the corner of the mold area.

5. The wiring board according to claim 1, further comprising:
   a plurality of openings provided continuously to each of the first, second, third and fourth slits, the openings extend to corresponding one of first, second, third and fourth sides.

6. The wiring board according to claim 1,
   wherein two of the first slits arranging at both ends are longer than remaining ones of the first slits.

7. The wiring board according to claim 1, wherein the first slits are arranged along a first line that is in parallel to the first side,
   the second slits are arranged along a second line that is in parallel to the second side,
   the third slits are arranged along a third line that is in parallel to the third side, and
   the fourth slits are arranged along a fourth line that is in parallel to the fourth side.

8. The wiring board according to claim 1, wherein at least one of the first, second, third and fourth slits includes a positioning portion for positioning the wiring board.

9. The wiring board according to claim 1,
   wherein the first and second sides are longer than the third and fourth sides, and the first and second slits are wider than the third and fourth slits.

10. The wiring board according to claim 1, further comprising:
    an absorption site provided on at least one of the first, second, third and fourth slits for adsorbing the wiring board.

11. A wiring board comprising:
    a device zone including a plurality of device formation areas;
    a frame including a mold area surrounding the device zone and a clamp area surrounding the mold area, the clamp area including a gate side and an air vent side opposed to the gate side;
    a plurality of first slits provided adjacent to the gate side in the clamp area, each of the first slits including a longitudinal extending along the gate side; and
    a plurality of second slits provided adjacent to the air vent side in the clamp area, each of the second slits including a longitudinal extending along the air vent side, and the longitudinal of at least one of the second slits being longer than that of the first slits,
    wherein the first and second slits are not filled with a sealant when the device zone and the mold area are sealed with the sealant.

12. The wiring board according to claim 11, wherein the clamp area includes a first side differing from the gate side and the air vent side, and a second side opposed to the first side, and the wiring board further comprising:
    a plurality of third slits provided adjacent to the first side in clamp area, each of the third slits including a longitudinal extending along the first side; and
    a plurality of fourth slits provided adjacent to the second side in clamp area, each of the fourth slits including a longitudinal extending along the second side.

13. The wiring board according to claim 11, wherein the first slits are arranged along a line that is in parallel to the gate side, and
    the second slits are arranged along a line that is in parallel to the air vent side.

14. An intermediate product comprising:
    a plurality of device formation areas;
    a frame surrounding the device formation areas;
    a plurality of semiconductor chips mounted over the plurality of device formation areas, respectively;
    a sealant provided over the plurality of device formation areas so as to collectively cover the semiconductor chops with the sealant, the sealant including first and second side opposed to each other and third and fourth side opposed to each other; and
    a plurality of first slits provided adjacent to the first side in the frame, each of the first slits including a longitudinal extending along the first side of the sealant;
    a plurality of second slits provided adjacent to the second side in the frame, each of the second slits including a longitudinal extending along the second side of the sealant;
    a plurality of third slits provided adjacent to the third side in the frame, each of the third slits including a longitudinal extending along the third side of the sealant; and
    a plurality of fourth slits provided adjacent to the fourth side in the frame, each of the fourth slits including a longitudinal extending along the fourth side of the sealant, wherein the first, second, third and fourth slits are not in contact with the sealant.

15. The wiring board according to claim 14, further comprising:
a corner slit provided adjacent to a corner of the sealant in the frame, the corner slit including a shape bending along the corner of the sealant.

16. The wiring board according to claim 14, wherein the first slits are arranged along a first line that is in parallel to the first side of the sealant, the second slits are arranged along a second line that is in parallel to the second side of the sealant, the third slits are arranged along a third line that is in parallel to the third side of the sealant, and the fourth slits are arranged along a fourth line that is in parallel to the fourth side of the sealant.

\* \* \* \* \*